(12) United States Patent
Kong et al.

(10) Patent No.: US 11,239,421 B2
(45) Date of Patent: Feb. 1, 2022

(54) EMBEDDED BEOL MEMORY DEVICE WITH TOP ELECTRODE PILLAR

(71) Applicant: International Business Machines Corporation, Armonk, NY (US)

(72) Inventors: Dexin Kong, Guilderland, NY (US); Soon-Cheon Seo, Glenmont, NY (US); Shyng-Tsong Chen, Rensselaer, NY (US); Youngseok Kim, Upper Saddle River, NJ (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 16/752,110

(22) Filed: Jan. 24, 2020

(65) Prior Publication Data
US 2021/0234095 A1    Jul. 29, 2021

(51) Int. Cl.
*H01L 45/00* (2006.01)
*H01L 27/24* (2006.01)

(52) U.S. Cl.
CPC ...... *H01L 45/1608* (2013.01); *H01L 27/2472* (2013.01); *H01L 45/1233* (2013.01); *H01L 45/1253* (2013.01); *H01L 45/146* (2013.01)

(58) Field of Classification Search
CPC .. H01L 45/1233; H01L 45/16; H01L 27/2463
See application file for complete search history.

(56) References Cited

U.S. PATENT DOCUMENTS

| | | | |
|---|---|---|---|
| 7,323,357 B2 | 1/2008 | Seidl | |
| 8,963,114 B2 | 2/2015 | Liao et al. | |
| 9,431,604 B2 | 8/2016 | Liao et al. | |
| 9,431,609 B2 | 8/2016 | Dang et al. | |
| 9,577,191 B2 | 2/2017 | Dang et al. | |
| 9,847,481 B2 * | 12/2017 | Chang | H01L 27/2436 |
| 9,941,470 B2 | 4/2018 | Yang et al. | |
| 10,008,387 B1 | 6/2018 | Wang et al. | |

(Continued)

OTHER PUBLICATIONS

Yang et al., "Selective Chemical Vapor Deposition-Grown Ru for Cu Interconnect Capping Applications," Electrochemical and Solid-State Letters, 13(5) D33-D35 (Mar. 2010).

*Primary Examiner* — Mark V Prenty
(74) *Attorney, Agent, or Firm* — L. Jeffrey Kelly; Michael J. Chang, LLC

(57) ABSTRACT

Embedded BEOL memory devices having a top electrode pillar are provided. In one aspect, a method of forming an embedded memory device includes: depositing a first ILD on a substrate; forming first/second interconnect in the first ILD over logic/memory regions of the substrate; depositing a capping layer onto the first ILD; forming a memory film stack on the capping layer; patterning the memory film stack into a memory device(s) including a bottom electrode, a dielectric element, and a top electrode; patterning the top electrode to form a pillar-shaped top electrode; depositing a conformal encapsulation layer over the capping layer and memory device(s); depositing a second ILD over the conformal encapsulation layer; and forming a first metal line(s) in the second ILD in contact with the first interconnect(s), and a second metal line(s) in the second ILD in contact with the pillar-shaped top electrode. A device is also provided.

14 Claims, 13 Drawing Sheets

(56) References Cited

U.S. PATENT DOCUMENTS

2009/0269507 A1 10/2009 Yu et al.
2014/0166961 A1 6/2014 Liao et al.
2016/0133828 A1 5/2016 Lu et al.
2017/0117467 A1 4/2017 Chang et al.

* cited by examiner

EMBEDDED BEOL MEMORY DEVICE WITH TOP ELECTRODE PILLAR

FIELD OF THE INVENTION

The present invention relates to embedded memory devices, and more particularly, to embedded back-end-of-line (BEOL) memory devices having a top electrode pillar.

BACKGROUND OF THE INVENTION

Resistive random access memory (RRAM) is a type of non-volatile memory. RRAM devices store information based on a resistance across a dielectric element. The dielectric is typically insulating. However, an applied voltage to the RRAM device is used to form an electrically-conductive path or filament through the dielectric element.

Memory devices such as RRAM can be integrated with other device elements such as logic devices in embedded circuit designs. However, accessing the memory devices in a memory integration scheme can present some notable challenges.

For example, current back-end-of-line (BEOL) embedded memory integration schemes have wide top-level metal lines landing directly on the RRAM stack which causes etch and reliability issues. For instance, if the etch for the metal line is too deep, the metal line can wrap around the RRAM stack, causing shorts between the top and bottom electrodes.

Therefore, improved BEOL memory integration schemes would be desirable.

SUMMARY OF THE INVENTION

The present invention provides embedded back-end-of-line (BEOL) memory devices having a top electrode pillar. In one aspect of the invention, a method of forming an embedded memory device is provided. The method includes: depositing a first interlayer dielectric (ILD) on a substrate; forming at least one first interconnect in the first ILD over a logic region of the substrate, and at least one second interconnect in the first ILD over a memory region of the substrate; depositing a capping layer onto the first ILD over the at least one first interconnect and the at least one second interconnect; forming a memory film stack on the capping layer, the memory film stack including a bottom electrode layer disposed on the capping layer, a dielectric layer disposed on the bottom electrode layer, and a top electrode layer disposed on the dielectric layer; patterning the memory film stack into at least one memory device including a bottom electrode disposed on the capping layer over the at least one second interconnect, a dielectric element disposed on the bottom electrode, and a top electrode disposed on the dielectric element, wherein the at least one memory device has a width W1; patterning the top electrode to form a pillar-shaped top electrode having a width W2, wherein W2<W1; depositing a conformal encapsulation layer over the capping layer and the at least one memory device; depositing a second ILD over the conformal encapsulation layer; and forming at least one first metal line in the second ILD in contact with the at least one first interconnect, and at least one second metal line in the second ILD in contact with the pillar-shaped top electrode.

In another aspect of the invention, another method of forming an embedded memory device is provided. The method includes: depositing a ILD on a substrate; forming at least one first interconnect in the first ILD over a logic region of the substrate, and at least one second interconnect in the first ILD over a memory region of the substrate; depositing a capping layer onto the first ILD over the at least one first interconnect and the at least one second interconnect; forming a contact that extends through the capping layer; forming a memory film stack on the capping layer, the memory film stack including a bottom electrode layer disposed on the capping layer, a dielectric layer disposed on the bottom electrode layer, and a top electrode layer disposed on the dielectric layer; patterning the memory film stack into at least one memory device including a bottom electrode disposed on the capping layer over the at least one second interconnect, a dielectric element disposed on the bottom electrode, and a top electrode disposed on the dielectric element, wherein the at least one memory device has a width W1, and wherein the contact connects the at least one memory device to the at least one second interconnect; patterning the top electrode to form a pillar-shaped top electrode having a width W2, wherein W2<W1, and wherein the bottom electrode has a thickness T1 and the pillar-shaped top electrode has a thickness T2, wherein T2>T1; depositing a conformal encapsulation layer over the capping layer and the at least one memory device; depositing a second ILD over the conformal encapsulation layer; and forming at least one first metal line in the second ILD in contact with the at least one first interconnect, and at least one second metal line in the second ILD in contact with the pillar-shaped top electrode.

In yet another aspect of the invention, a device is provided. The device includes: a first ILD disposed on a substrate; at least one first interconnect formed in the first ILD over a logic region of the substrate, and at least one second interconnect formed in the first ILD over a memory region of the substrate; a capping layer disposed on the first ILD over the at least one first interconnect and the at least one second interconnect; at least one memory device disposed on the capping layer including a bottom electrode disposed on the capping layer over the at least one second interconnect, a dielectric element disposed on the bottom electrode, and a pillar-shaped top electrode disposed on the dielectric element, wherein the bottom electrode and the dielectric element have a width W1 and the pillar-shaped top electrode has a width W2, wherein W2<W1; a conformal encapsulation layer disposed over the capping layer and the at least one memory device; a second ILD disposed over the conformal encapsulation layer; and at least one first metal line formed in the second ILD in contact with the at least one first interconnect, and at least one second metal line formed in the second ILD in contact with the pillar-shaped top electrode.

A more complete understanding of the present invention, as well as further features and advantages of the present invention, will be obtained by reference to the following detailed description and drawings.

DETAILED DESCRIPTION OF PREFERRED EMBODIMENTS

As provided above, current back-end-of-line (BEOL) embedded memory integration schemes have etch and reliability issues. For example, landing a top-level metal line directly on the memory stack can undesirably lead to shorts across the memory stack if the metal line is wide and happens to wrap around the memory stack contacting both the top electrode and the bottom electrode.

Advantageously, provided herein are improved BEOL memory integration schemes that employ a tall (pillar-shaped) top electrode. As will be described in detail below, a tall top electrode enables a top-level metal line to be formed directly on the memory device without concern over shorts across the memory stack. Namely, even if the top-level metal line is wide and wraps around the top electrode, the tall top electrode offsets the top-level metal line from the underlying memory stack. Thus, shorts between the top and bottom electrodes of the memory device are avoided.

Figure 1:
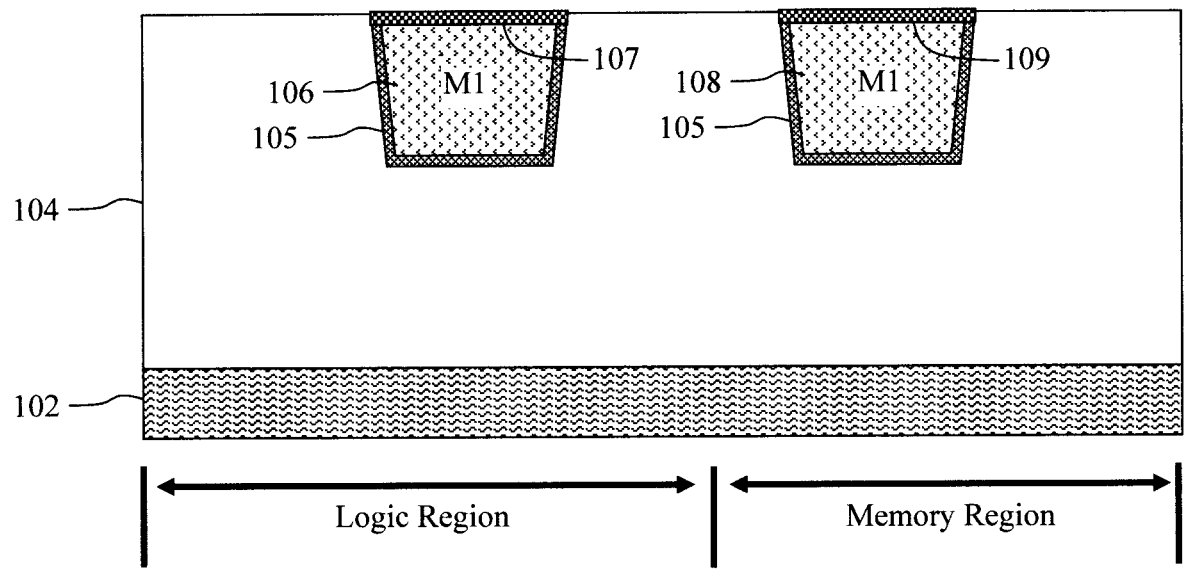
FIG. 1 is a cross-sectional diagram illustrating a (first) interlayer dielectric (ILD) having been deposited onto a substrate, at least one first interconnect having been formed in the first ILD over a logic region of the substrate, and at least one second interconnect having been formed in the first ILD over a memory region of the substrate according to an embodiment of the present invention.
Figure 2:
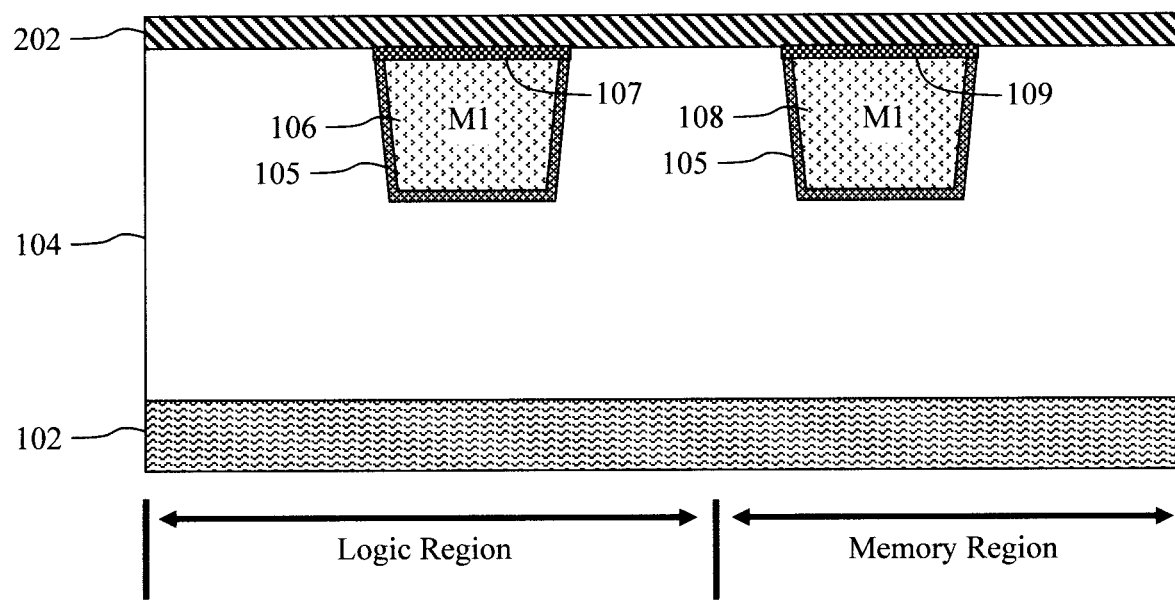
FIG. 2 is a cross-sectional diagram illustrating a capping layer having been deposited onto the first ILD over the first/second interconnects according to an embodiment of the present invention.

An exemplary methodology for forming an embedded memory device is now described by way of reference to FIGS. 1-18. As shown in FIG. 1, the process begins with the deposition of an interlayer dielectric (ILD) 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Suitable materials for the ILD 104 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD) or physical vapor deposition (PVD) can be employed to deposit the ILD 104 onto substrate 102. Following deposition, ILD 104 can be planarized using a process such as chemical-mechanical polishing (CMP). According to an exemplary embodiment, ILD 104 has a thickness of from about 5 nanometers (nm) to about 20 nm and ranges therebetween.

A first metal level (M1) is then built in the ILD 104. As shown in FIG. 1, metal level M1 includes at least one first interconnect 106 formed in ILD 104 over a logic region of substrate 102, and at least one second interconnect 108 formed in ILD 104 over a memory region of substrate 102. According to an exemplary embodiment, interconnects 106 and 108 are formed in ILD 104 using standard lithography and etching techniques to first pattern features (e.g., vias and/or trenches) in ILD 104 and then filling the features with a contact metal(s) to form interconnects 106 and 108. A directional (anisotropic) etching process such as reactive ion etching (RIE) can be employed for patterning the features.

Suitable contact metals include, but are not limited to, copper (Cu), tungsten (W), ruthenium (Ru), cobalt (Co), nickel (Ni) and/or platinum (Pt). A process such as evaporation, sputtering, or electrochemical plating can be employed to deposit the contact metal(s) into the features. Following deposition, the metal overburden can be removed using a process such as CMP. Prior to depositing the contact metal(s) into the features, a conformal barrier layer 105 can be deposited into and lining the features. Use of such a barrier layer 105 helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). A process such as CVD, ALD or PVD can be employed to conformally deposit the barrier layer 105 into/lining the features. According to an exemplary embodiment, the barrier layer 105 has a thickness of from about 5 angstroms (Å) to about 1 nm and ranges therebetween. Additionally, a seed layer (not shown) can be deposited into and lining the features prior to contact metal deposition. A seed layer facilitates plating of the contact metal into the features.

As shown in FIG. 1, a cap 107 and a cap 109 can then be formed on interconnects 106 and 108, respectively. Suitable materials for cap 107 and a cap 109 include, but are not limited to, Co, Ru, Ta, TaN, Ti, and/or TiN. By way of example only, a selective deposition process can be employed to deposit the cap material selectively onto the top surfaces of interconnects 106 and 108. See, for example, U.S. Patent Application Publication Number 2009/0269507 by Yu et al., entitled "Selective Cobalt Deposition on Copper Surfaces" and Yang et al., "Selective Chemical Vapor Deposition-Grown Ru for Cu Interconnect Capping Applications," Electrochemical and Solid-State Letters, 13(5) D33-D35 (March 2010), the contents of each of which are incorporated by reference as if fully set forth herein. According to an exemplary embodiment, cap 107 and a cap 109 each has a thickness of from about 5 Å to about 1 nm and ranges therebetween.

A capping layer 202 is then deposited onto ILD 104 over the interconnects 106 and 108 in the logic and memory regions of substrate 102, respectively. See FIG. 2. Suitable materials for capping layer 202 include, but are not limited to, silicon nitride (SiN), silicon oxynitride (SiON) and/or silicon oxycarbonitride (SiOCN). A process such as CVD, ALD or PVD can be employed to deposit capping layer 202 onto ILD 104. According to an exemplary embodiment, capping layer 202 has a thickness of from about 2 nm to about 10 nm and ranges therebetween. Capping layer 202 will serve to protect the underlying interconnect 106 in the logic region of substrate 102 during formation of the embedded memory device in the memory region of substrate 102.

Figure 3:
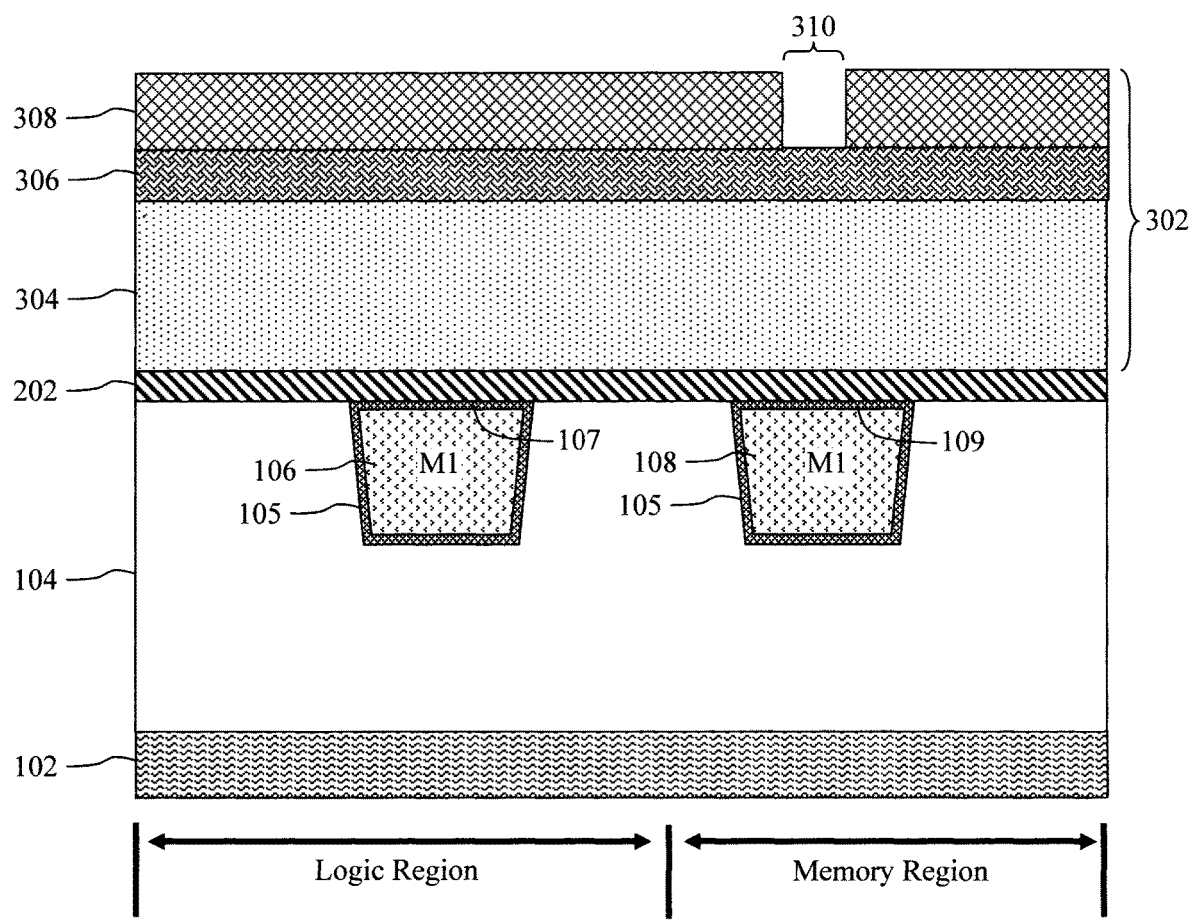
FIG. 3 is a cross-sectional diagram illustrating a lithographic stack (an organic planarizing layer (OPL), an anti-reflective coating (ARC), and a photoresist) having been formed on the capping layer over the first/second interconnects according to an embodiment of the present invention.
Figure 4:
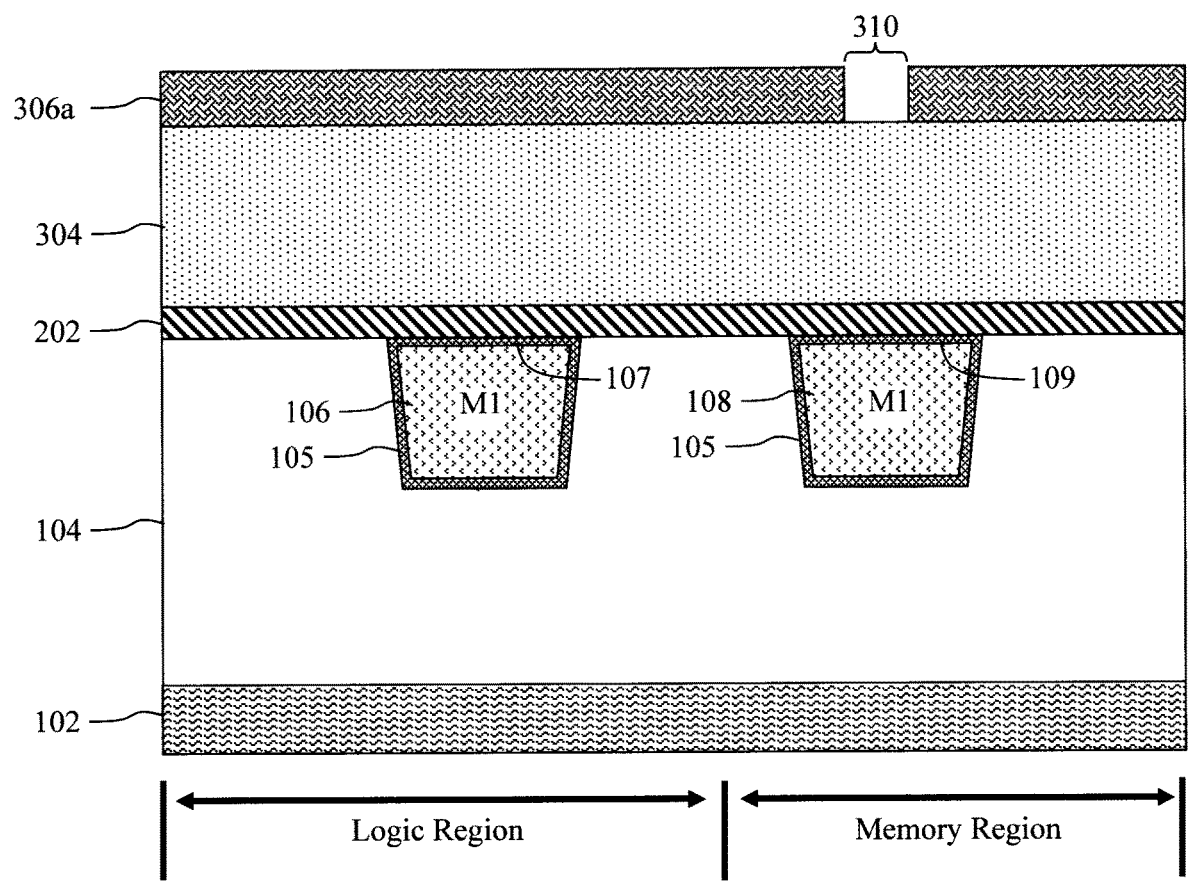
FIG. 4 is a cross-sectional diagram illustrating a pattern from the photoresist having been transferred to the ARC, after which the photoresist is removed according to an embodiment of the present invention.
Figure 5:
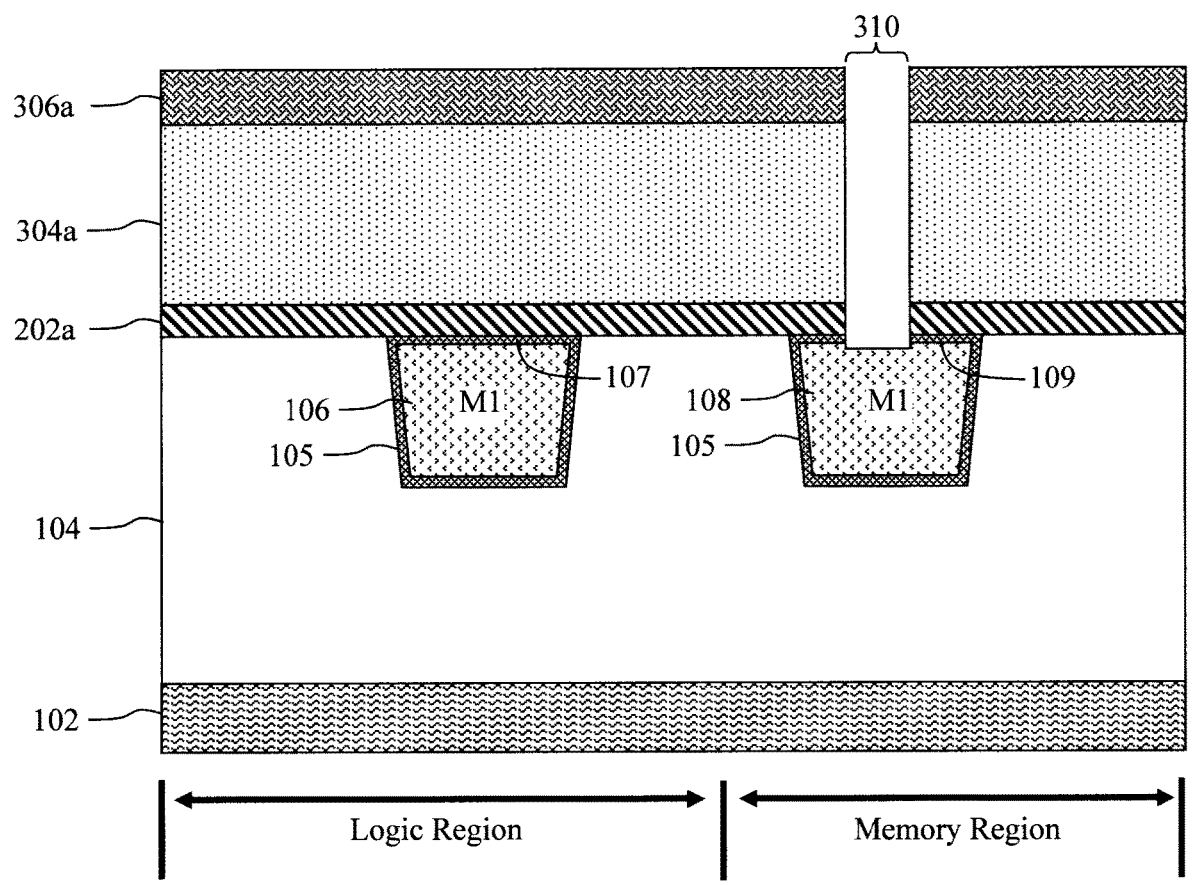
FIG. 5 is a cross-sectional diagram illustrating the pattern from the ARC having been transferred to the underlying OPL and capping layer according to an embodiment of the present invention.

A lithography and etching process is then employed to pattern a contact hole aligned to interconnect 108 in the memory region of substrate 102. For instance, as shown in FIG. 3, a lithographic stack 302 is formed on capping layer 202 over the interconnects 106 and 108. In this particular example, lithographic stack 302 includes an organic planarizing layer (OPL) 304 disposed on the capping layer 202, an anti-reflective coating (ARC) 306 disposed on the OPL 304, and a photoresist 308 disposed on the ARC 306.

A casting process such as spin-coating or spray coating can be employed to deposit the OPL 304 onto the capping layer 202. According to an exemplary embodiment, OPL 304 has a thickness of from about 10 nm to about 30 nm and ranges therebetween. A process such as CVD, PVD or spin-coating can be employed to deposit ARC 306 onto the OPL 304. According to an exemplary embodiment, ARC 306 has a thickness of from about 5 nm to about 10 nm and ranges therebetween. A casting process such as spin-coating or spray coating can be employed to deposit photoresist 308 onto the ARC 306. According to an exemplary embodiment, photoresist 308 has a thickness of from about 5 nm to about 10 nm and ranges therebetween.

A bake of the photoresist 308 (i.e., a post-apply bake) is performed to remove excess solvent. The photoresist 308 is then exposed to light. Typically, exposure of the photoresist 308 is performed using a patterned mask such that photoresist 308 is only exposed to the light in the unmasked regions. Following exposure, the photoresist 308 can be baked (i.e., a post-exposure bake) to accelerate the exposure reaction.

The photoresist 308 is then contacted with a developer solution to remove the exposed or non-exposed portions of the photoresist 308, in the case of a positive photoresist or a negative photoresist, respectively. As shown in FIG. 3, developing the photoresist 308 in this manner creates a pattern 310 in the photoresist 308 over the interconnect 108 in the memory region of substrate 102.

The pattern 310 from photoresist 308 is then transferred to the underlying ARC 306, after which the photoresist 308 is removed. See FIG. 4. The patterned ARC is now given reference numeral 306a. A directional (anisotropic) dry or wet etching process can be employed to transfer the pattern 310 from the photoresist 308 to ARC 306. Photoresist 308 can be removed using a suitable solvent such as 1-methyl-2-pyrrolidone (NMP) or any other commercially-available photoresist remover.

A directional (anisotropic) dry or wet etching process (or combination of etching processes) can then be employed to transfer the pattern 310 from ARC 306a to the underlying OPL 304 and capping layer 202. See FIG. 5. The patterned OPL and capping layer are now given reference numeral 304a and 202a, respectively. Any remaining ARC 306a and the OPL 304a are then removed. See FIG. 6. ARC 306a can be removed using any commercially-available ARC remover. OPL 304a can be removed using a process such as plasma ashing.

Figure 6:
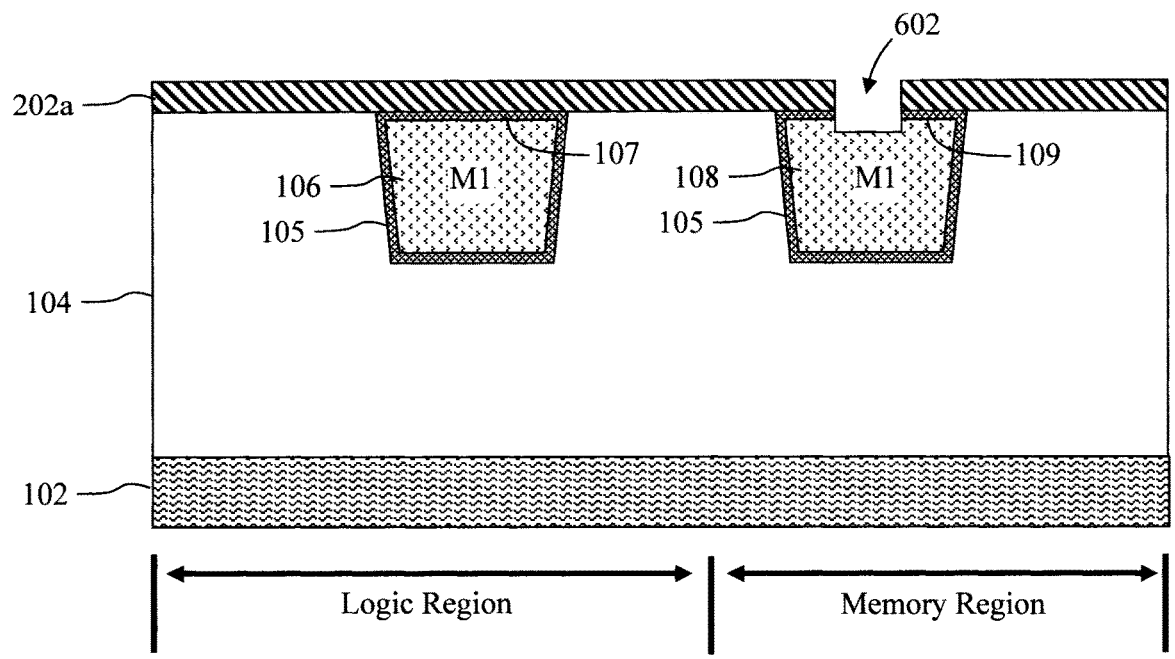
FIG. 6 is a cross-sectional diagram illustrating the ARC and the OPL having been removed and the trench that has now been formed in the capping layer over the second interconnect according to an embodiment of the present invention.

As shown in FIG. 6, a trench 602 is now present in capping layer 202a over interconnect 108. Trench 602 extends through the cap 109 landing on interconnect 108. Depending on the selectivity of the etch, trench 602 may extend slightly into interconnect 108.

Figure 7:
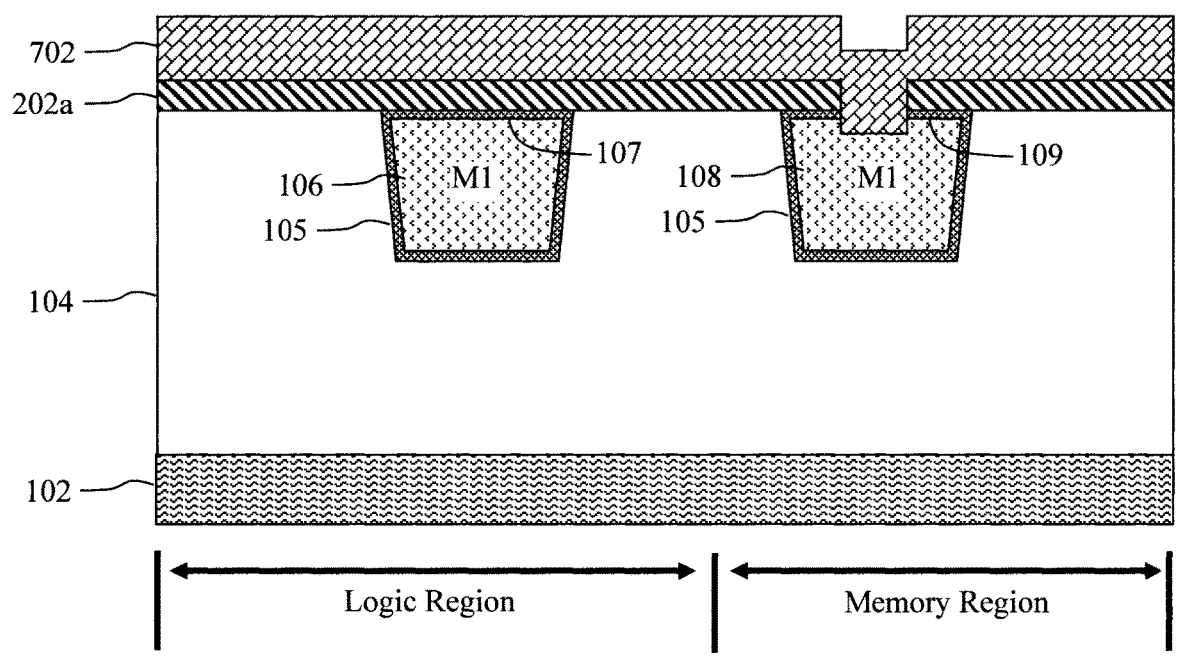
FIG. 7 is a cross-sectional diagram illustrating a metal layer having been deposited onto the capping layer, and filling the trench according to an embodiment of the present invention.

For continuity between interconnect 108 and the memory device that will be built on top of interconnect 108 (see below), trench 602 is next filled with a conductor such as a metal. Namely, as shown in FIG. 7, a metal layer 702 is deposited onto capping layer 202a, and filling trench 602. Suitable metals for layer 702 include, but are not limited to, tungsten (W), TiN and/or TaN. A process such as CVD, ALD or PVD can be used to deposit metal layer 702 onto capping layer 202a. According to an exemplary embodiment, metal layer 702 has a thickness of from about 5 nm to about 15 nm and ranges therebetween. Metal layer 702 is blanket deposited over the capping layer 202a and, at this stage, covers both the logic and memory regions of the substrate 102.

Figure 8:
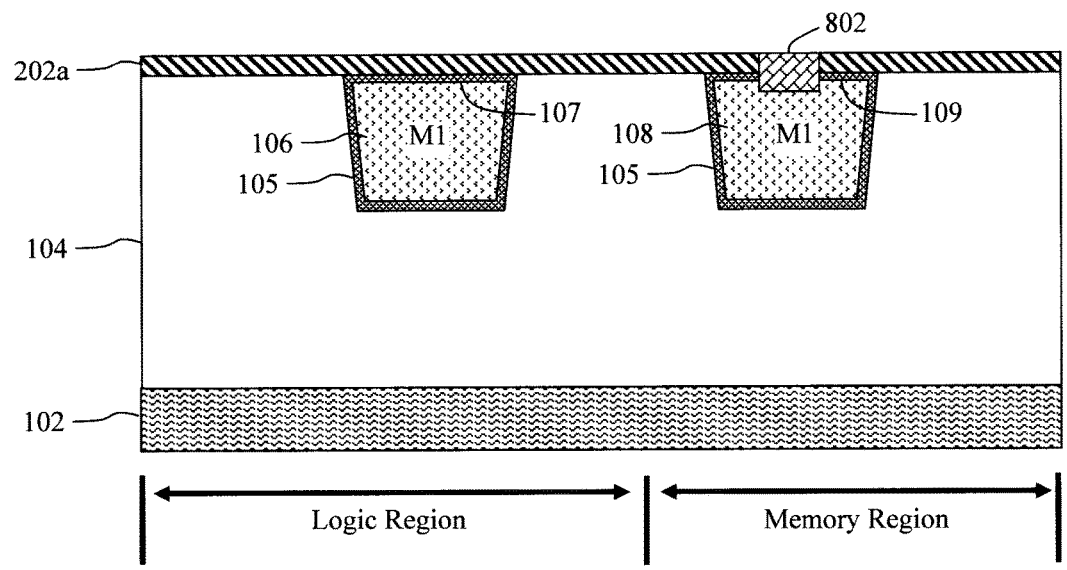
FIG. 8 is a cross-sectional diagram illustrating portions of the metal layer having been removed from over the capping layer to form a contact in the trench according to an embodiment of the present invention.

However, a planarizing process such as CMP is then used to remove the portions of metal layer 702 over capping layer 202a. See FIG. 8. As shown in FIG. 8, as a result of this planarization process, the thickness of capping layer 202 can be reduced, e.g., by an amount of from about 1 nm to about 3 nm and ranges therebetween. As also shown in FIG. 8, what remains of the metal layer 702 forms a contact 802 in trench 602. Contact 802 extends through the capping layer 202a to (electrically) connect interconnect 108 with the memory device to be formed on the capping layer 202a as described below.

Figure 9:
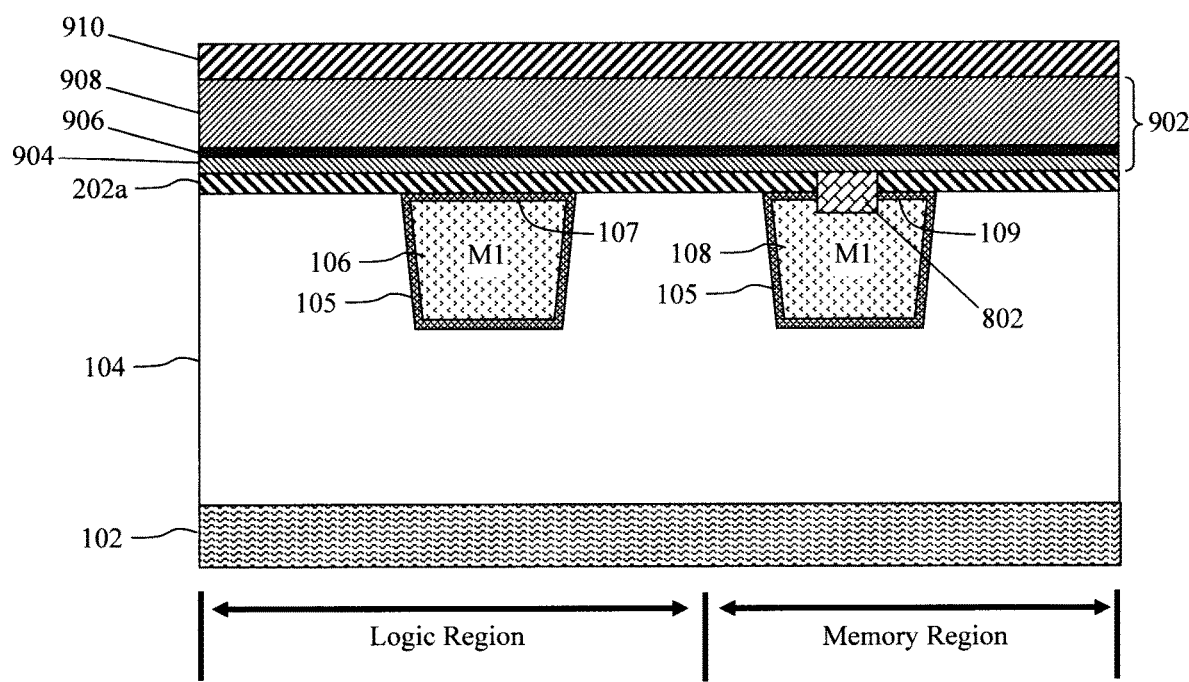
FIG. 9 is a cross-sectional diagram illustrating a memory film stack (bottom electrode layer, dielectric layer and top electrode layer) having been formed on the capping layer over the contact, and a hardmask layer having been formed on the memory film stack according to an embodiment of the present invention.
Figure 10:
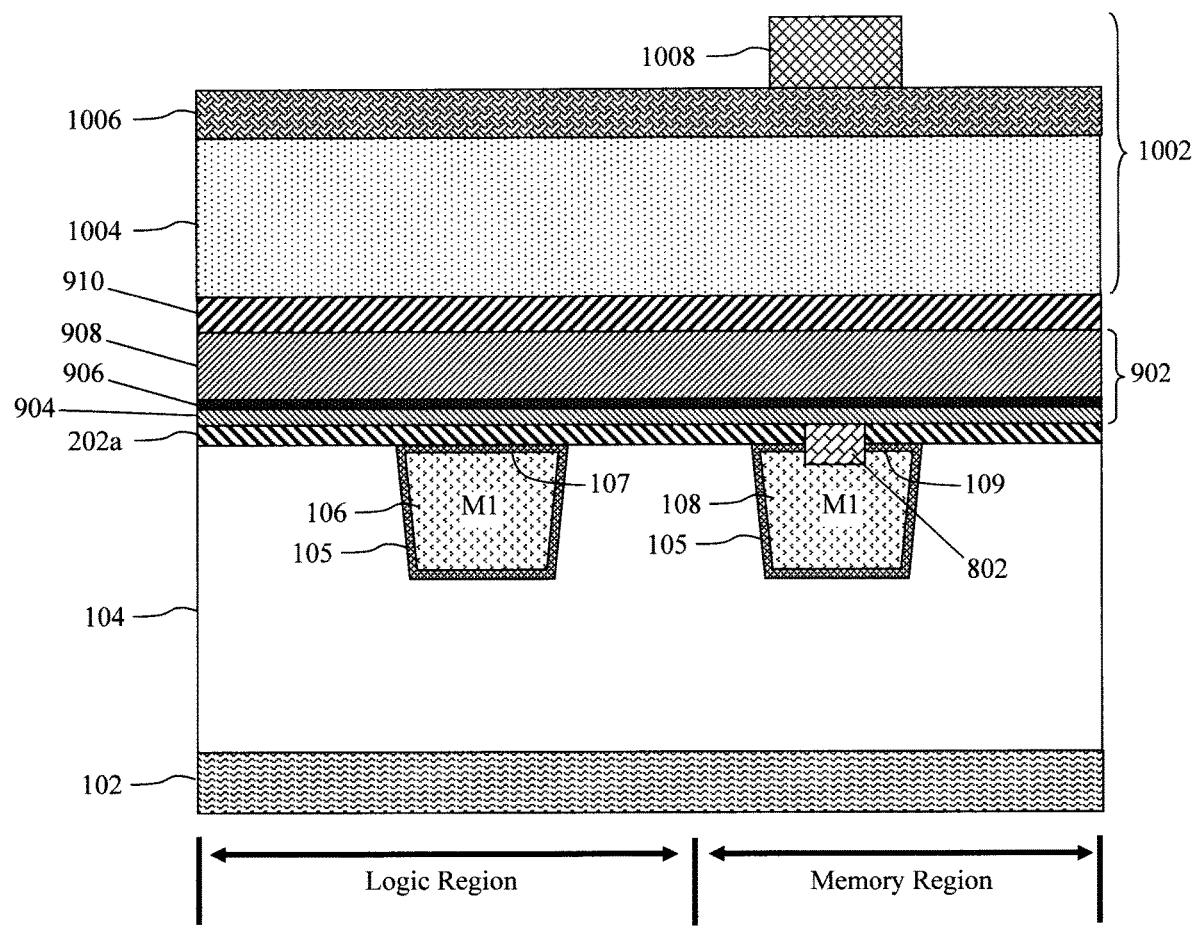
FIG. 10 is a cross-sectional diagram illustrating a lithographic stack (an OPL, an ARC, and a photoresist) having been formed on the hardmask layer over the memory film stack according to an embodiment of the present invention.
Figure 11:
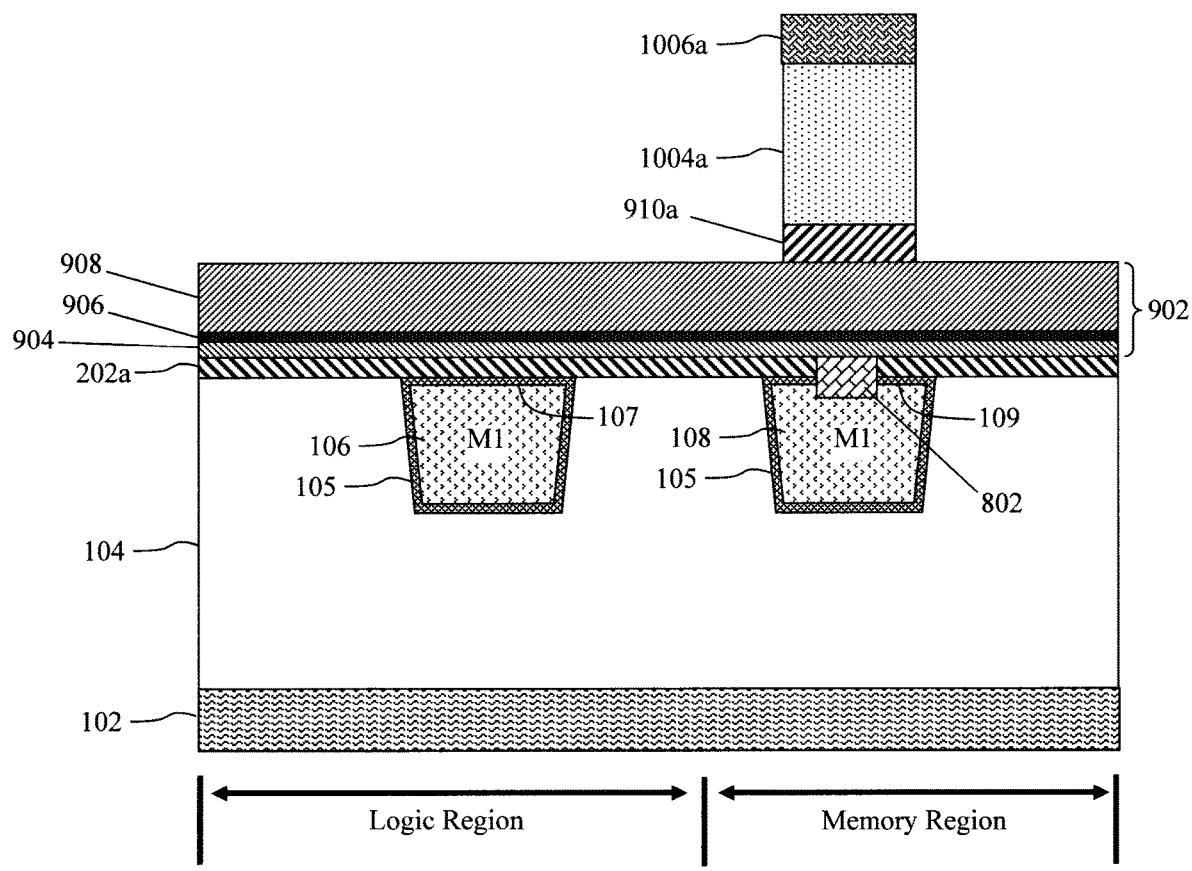
FIG. 11 is a cross-sectional diagram illustrating a pattern from the photoresist having been transferred to the ARC, after which the photoresist is removed, and the pattern from the ARC having been transferred to the underlying OPL and hardmask layer according to an embodiment of the present invention.

Fabrication of the memory device begins with the formation of a memory film stack 902 on the capping layer 202a over contact 802. See FIG. 9. As shown in FIG. 9, memory film stack 902 includes a bottom electrode layer 904 disposed on capping layer 202a, a dielectric layer 906 disposed on the bottom electrode layer 904, and a top electrode layer 908 disposed on the dielectric layer 906. A hardmask layer 910 is then disposed on memory film stack 902.

Suitable materials for the bottom electrode layer 904 include, but are not limited to, TiN having a Ti/N ratio of less than or equal to (≤) 1, TaN, W and/or noble metals such as platinum (Pt), iridium (Ir) and/or ruthenium (Ru). A process such as CVD, ALD or PVD can be employed to deposit the bottom electrode layer 904 onto capping layer 202a. According to an exemplary embodiment, bottom electrode layer 904 has a thickness T1 of from about 2 nm to about 10 nm and ranges therebetween. As provided above, a thicker top electrode will be employed to prevent shorting between the top and bottom electrodes of the memory device during top-level metallization.

Suitable materials for dielectric layer 906 include, but are not limited to, metal oxides such as hafnium oxide ($HfO_2$), lanthanum oxide ($LaO_2$) and/or strontium titanate ($SrTiO_3$). A process such as CVD, ALD or PVD can be employed to deposit the dielectric layer 906 onto bottom electrode layer 904. According to an exemplary embodiment, dielectric layer 906 has a thickness of from about 1 nm to about 5 nm and ranges therebetween.

According to an exemplary embodiment, top electrode layer 908 is formed from a reactive (oxidizable) metal such as TiN having a titanium to nitrogen (Ti/N) ratio of greater than (>) 1, Ti-containing alloys (such as TiN and/or tungsten titanium (TiW)) and/or aluminum (Al)-containing alloys (such as titanium aluminum carbide (TiAlC)). A process such as CVD, ALD or PVD can be employed to deposit the top electrode layer 908 onto dielectric layer 906. Preferably, top electrode layer 908 has a thickness T2 that is greater than the thickness T1 of bottom electrode layer 904, i.e., T2>T1. According to an exemplary embodiment, top electrode layer 908 has the thickness T2 of from about 5 nm to about 15 nm and ranges therebetween.

This thicker top electrode (T2) will serve to prevent shorting between the top and bottom electrodes of the memory device during top-level metallization.

Suitable materials for hardmask layer 910 include, but are not limited to, nitride hardmask materials such as SiN, SiON, silicon carbide nitride (SiCN), and/or oxide hardmask materials such as SiOx. A process such as CVD, ALD or PVD can be employed to deposit hardmask layer 910 onto top electrode layer 908. According to an exemplary embodiment, hardmask layer 910 has a thickness of from about 2 nm to about 10 nm and ranges therebetween.

As deposited, the memory film stack 902 is present over both the memory and logic regions of the substrate 102. However, lithography and etching techniques are then employed to pattern the memory film stack 902 into at least one memory device over the interconnect 108. Following the same basic process described in detail above, a lithographic stack 1002 is formed on hardmask layer 910 over the memory film stack 902. See FIG. 10. In this particular example, lithographic stack 1002 includes an OPL 1004 disposed on hardmask layer 910, an ARC 1006 disposed on the OPL 1004, and a patterned photoresist 1008 disposed on the ARC 1006. A detailed description of each of these lithographic stack layers was provided above. Also provided above was a detailed description of the exposure and development processes that can be employed to pattern photoresist 1008.

The pattern from photoresist 1008 is then transferred to the underlying ARC 1006 (after which the photoresist 1008 is removed) and, in the same manner as described above, a directional (anisotropic) dry or wet etching process (or combination of etching processes) is then used to transfer the pattern from ARC 1006 to the underlying OPL 1004 and hardmask layer 910. See FIG. 11. The patterned ARC, OPL and hardmask layers are now given reference numerals 1006a, 1004a and 910a, respectively.

Figure 12:
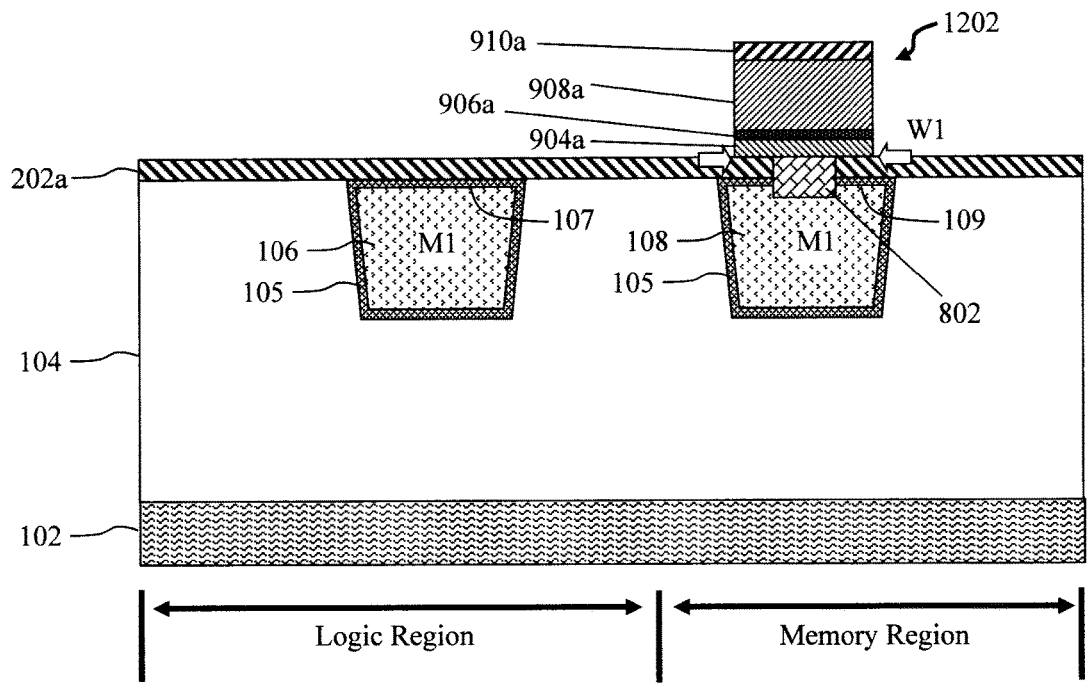
FIG. 12 is a cross-sectional diagram illustrating the ARC and OPL having been removed, and the (patterned) hardmask layer having been used to pattern the underlying memory film stack into at least one individual memory device (bottom electrode, dielectric element and top electrode) according to an embodiment of the present invention.
Figure 13:
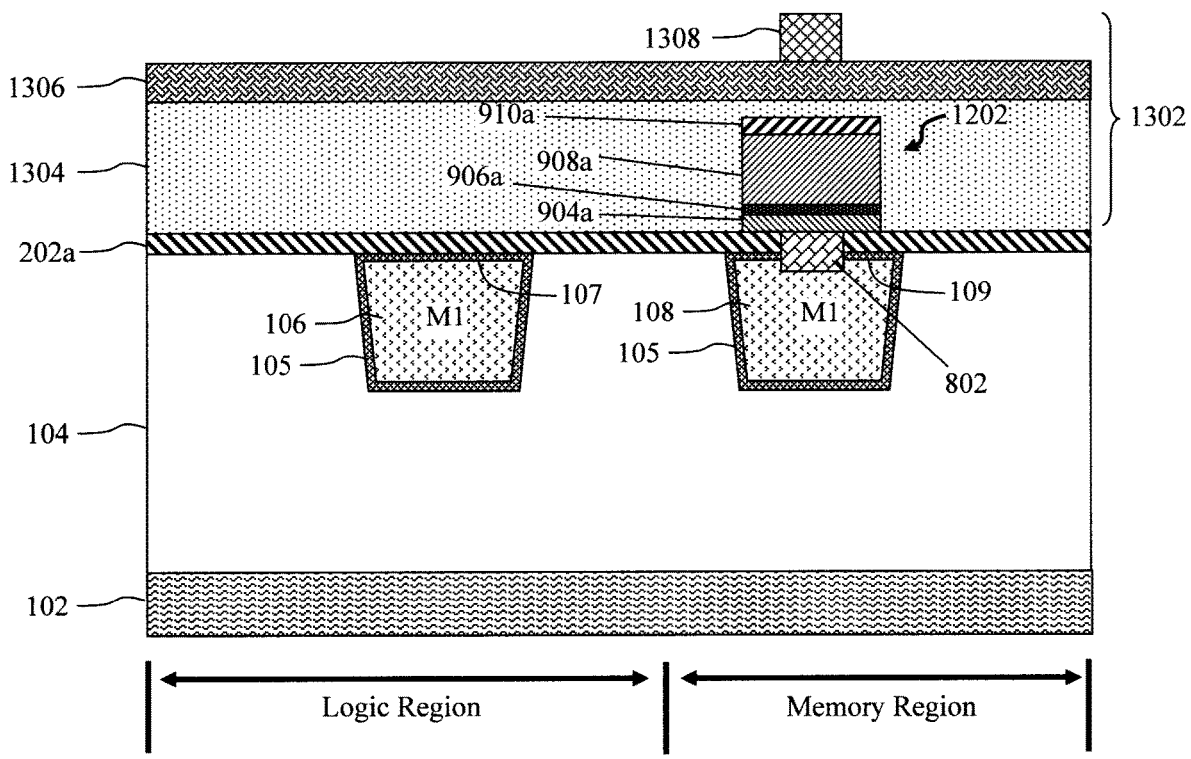
FIG. 13 is a cross-sectional diagram illustrating a lithographic stack (an OPL, an ARC, and a photoresist) having been formed on the capping layer over the memory device according to an embodiment of the present invention.
Figure 14:
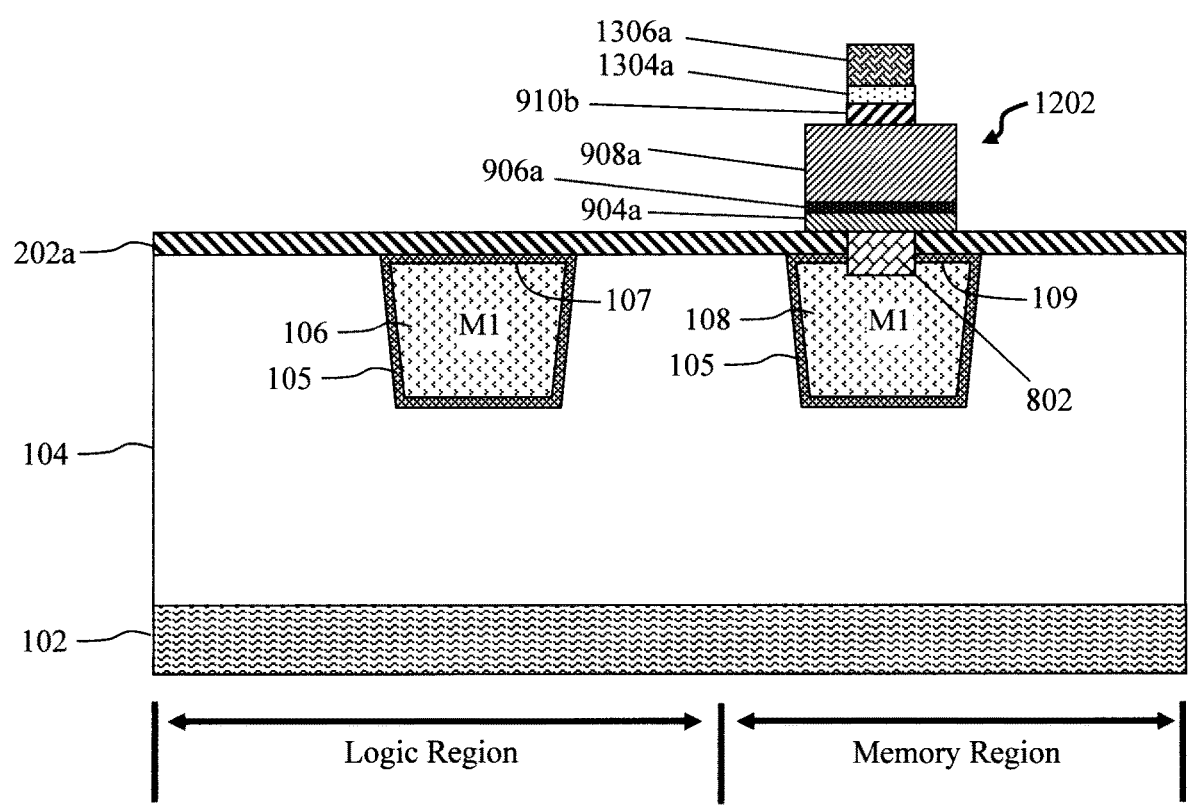
FIG. 14 is a cross-sectional diagram illustrating a pattern from the photoresist having been transferred to the ARC, after which the photoresist is removed, and the pattern from the ARC having been transferred to the underlying OPL and hardmask layer according to an embodiment of the present invention.

Any remaining ARC 1006a and OPL 1004a are then removed, and the (patterned) hardmask layer 910a is used to pattern the underlying memory film stack 902 into at least one individual memory device 1202. See FIG. 12. Namely, as shown in FIG. 12, a directional (anisotropic) etching process such as RIE (or a series of RIE steps) is used to transfer the pattern from hardmask layer 910a to the bottom electrode layer 904, dielectric layer 906, and top electrode layer 908 from which the patterned portions thereof form a bottom electrode 904a, a dielectric element 906a and a top electrode 908a, respectively. As a result of this etching process, the thickness of hardmask layer 910a can be reduced, e.g., by an amount of from about 1 nm to about 3 nm and ranges therebetween.

Based on the thicknesses of the bottom electrode layer 904, dielectric layer 906, and top electrode layer 908 provided above, the bottom electrode 904a too has the thickness T1 of from about 2 nm to about 10 nm and ranges therebetween, and the top electrode 908a has the thickness T2 of from about 5 nm to about 15 nm and ranges therebetween, where T2>T1. The dielectric element 906a has a thickness of from about 1 nm to about 5 nm and ranges therebetween. This thicker top electrode (T2) will serve to prevent shorting between the top and bottom electrodes of the memory device during top-level metallization.

At this stage in the process, the memory device 1202 has a uniform width W1. However, lithography and etching techniques will next be employed to pattern the top electrode 908a into a pillar-shaped electrode. Namely, following the same basic process described in detail above, a lithographic stack 1302 is formed on capping layer 202a over memory device 1202. In this particular example, lithographic stack 1302 includes an OPL 1304 disposed on capping layer 202a over memory device 1202, an ARC 1306 disposed on the OPL 1304, and a patterned photoresist 1308 disposed on the ARC 1306. A detailed description of each of these lithographic stack layers was provided above. Also provided above was a detailed description of the exposure and development processes that can be employed to pattern photoresist 1308.

The pattern from photoresist 1308 is then transferred to the underlying ARC 1306 (after which the photoresist 1308 is removed) and, in the same manner as described above, a directional (anisotropic) dry or wet etching process (or combination of etching processes) is then used to transfer the pattern from ARC 1306 to the underlying OPL 1304 and hardmask layer 910a. See FIG. 14. The patterned ARC, OPL and hardmask layers are now given reference numerals 1306a, 1304a and 910b, respectively.

Figure 15:
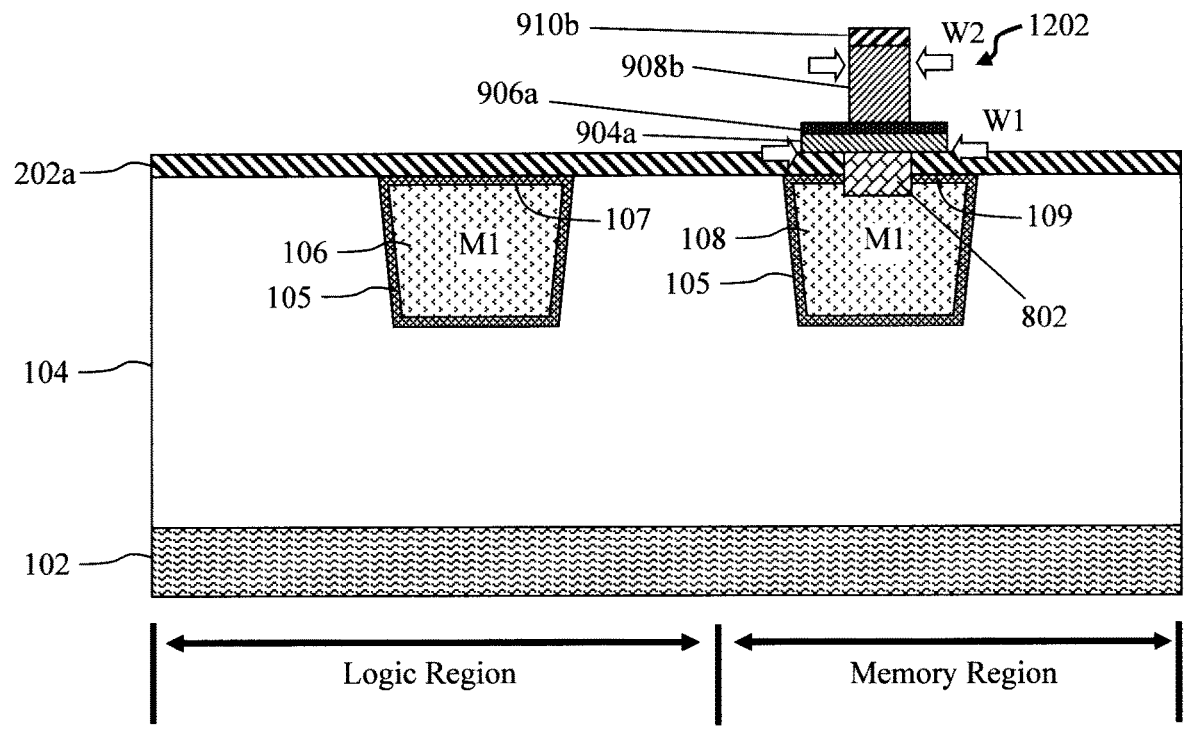
FIG. 15 is a cross-sectional diagram illustrating the ARC and OPL having been removed, and the (patterned) hardmask layer having been used to pattern the underlying top electrode into a pillar-shaped top electrode according to an embodiment of the present invention.
Figure 16:
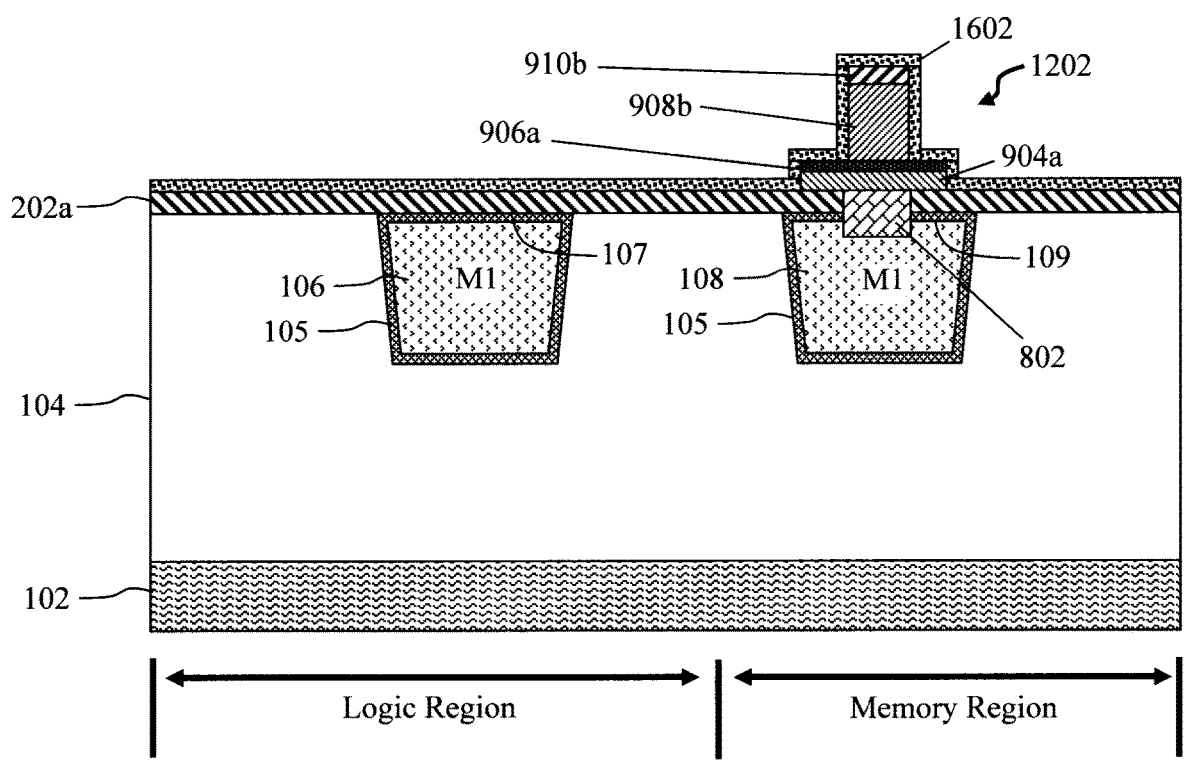
FIG. 16 is a cross-sectional diagram illustrating a conformal encapsulation layer having been deposited onto the capping layer according to an embodiment of the present invention.
Figure 17:
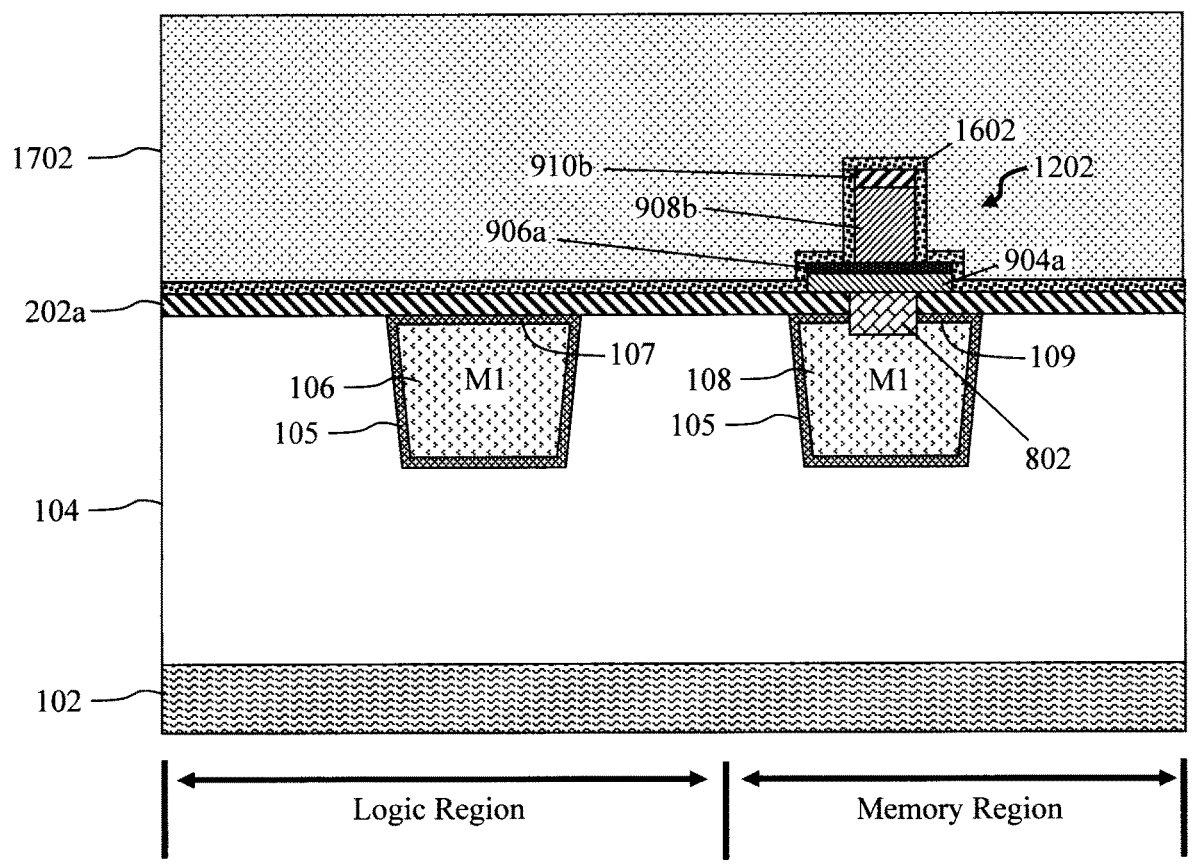
FIG. 17 is a cross-sectional diagram illustrating a second ILD having been deposited onto the encapsulation layer according to an embodiment of the present invention.

Any remaining ARC 1306a and OPL 1304a are then removed, and the (patterned) hardmask layer 910b is used to pattern the underlying top electrode 908a into a pillar-shaped top electrode. See FIG. 15. Namely, as shown in FIG. 15, a directional (anisotropic) etching process such as RIE is used to transfer the pattern from hardmask layer 910b to the top electrode which is now pillar-shaped and given the reference numeral 908b. Dielectric element 906a acts as an etch stop for this etch of the top electrode 908b. As a result, the bottom electrode 904a and dielectric element 906a of memory device 1202 have a width W1, and the (pillar-shaped) top electrode 908b has a width W2 whereby W2 is less than W1, i.e., W2<W. According to an exemplary embodiment, the width W1 is from about 10 nm to about 20 nm and ranges therebetween, and the width W2 is from about 5 nm to about 10 nm and ranges therebetween. Further, as provided above, the bottom electrode 904a has the thickness T1 (e.g., of from about 2 nm to about 10 nm and ranges therebetween) and the top electrode 908a has the thickness T2 (e.g., of from about 5 nm to about 15 nm and ranges therebetween) where T2>T1.

According to an exemplary embodiment, memory device 1202 serves as a resistive random access memory (RRAM) device. During operation of the RRAM device, when a positive bias is applied to the bottom electrode layer 904a, ions from the bottom electrode layer 904a migrate through dielectric layer 906a toward top electrode layer 908b forming electrically-conductive filaments in dielectric layer 906a, decreasing the resistance of the device. This operation is also referred to herein as a 'SET' process. Reversing the bias causes the filament to break or rupture, increasing the resistance of the device. This operation is also referred to herein as a 'RESET' process.

A conformal encapsulation layer 1602 is then deposited onto the capping layer 202a in the logic region of the substrate 102, and onto the capping layer 202a/over memory device 1202 in the memory region of the substrate 102. See FIG. 16. Suitable materials for the encapsulation layer 1602 include, but are not limited to, SiN, SiON and/or SiOCN. A process such as CVD, ALD or PVD can be employed to deposit the encapsulation layer 1602. According to an exemplary embodiment, encapsulation layer 1602 has a thickness of from about 2 nm to about 10 nm and ranges therebetween. Encapsulation layer 1602 will protect the memory device 1202 during top-level metallization (see below).

An ILD 1702 is then deposited onto the encapsulation layer 1602 over the logic and memory regions of the substrate 102, burying the memory device 1202. See FIG. 17. ILD 1702 may also be referred to herein as a "second ILD" whereby ILD 104 is the "first ILD." Suitable materials for the ILD 1702 include, but are not limited to, oxide low-θ materials such as SiOx and/or oxide ULK-ILD materials such as pSiCOH. A process such as CVD, ALD or PVD can be employed to deposit the ILD 1702 onto the encapsulation layer 1602. Following deposition, ILD 1702 can be planarized using a process such as CMP. According to an exemplary embodiment, ILD 1702 has a thickness of from about 5 nm to about 15 nm and ranges therebetween.

Figure 18:
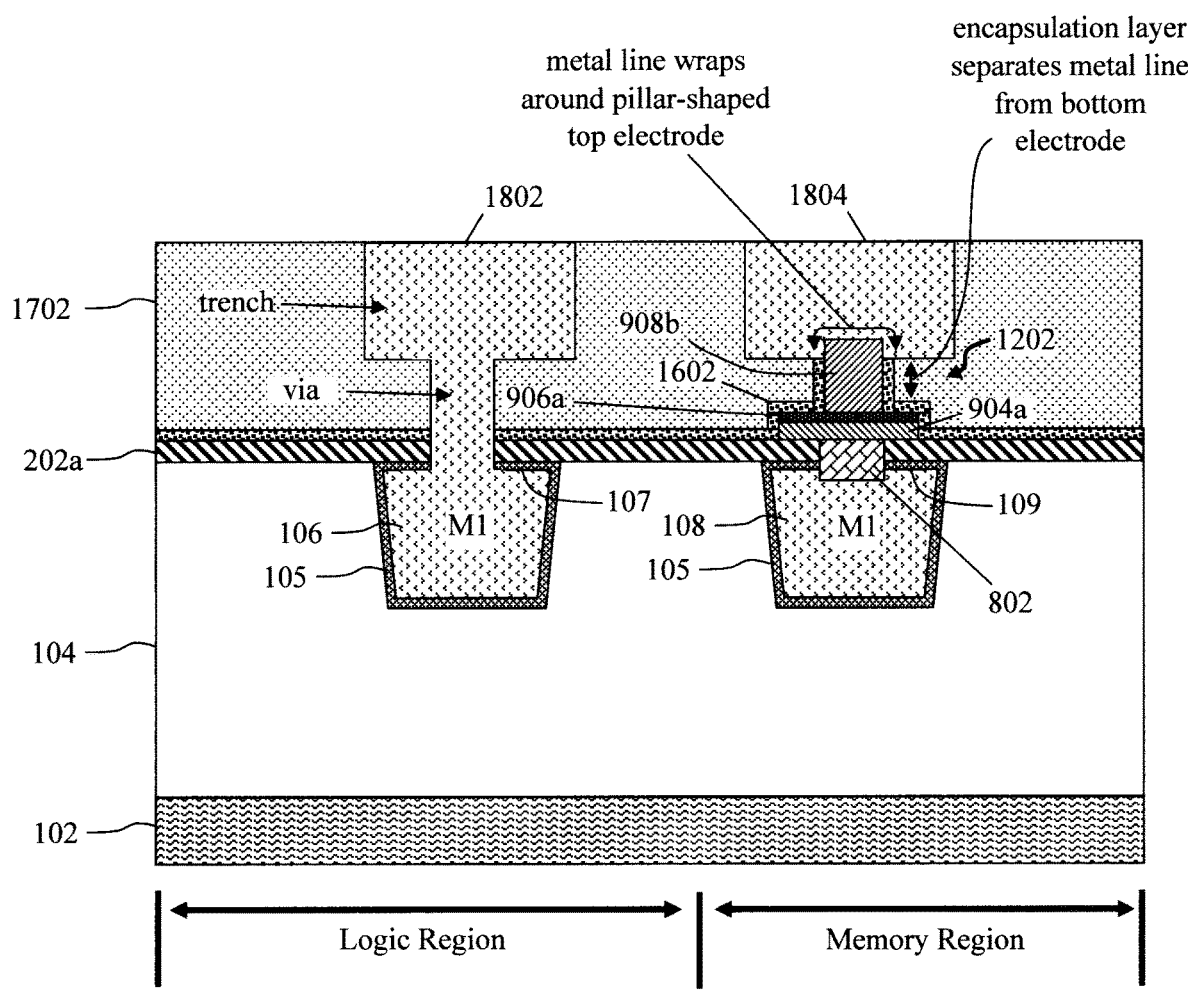
FIG. 18 is a cross-sectional diagram illustrating at least one first metal line having been formed in the second ILD over the logic region of substrate in contact with the first interconnect, and at least one second metal line having been formed in the second ILD over the memory region of substrate in contact with the memory device according to an embodiment of the present invention.

A second (top-level) metal level (M2) is then built in the ILD 1702. See FIG. 18. As shown in FIG. 18, the M2 metal level includes at least one first metal line 1802 formed in the ILD 1702 over the logic region of substrate 102 in contact with interconnect 106, and at least one second metal line 1804 formed in the ILD 1702 over the memory region of substrate 102 in contact with the memory device 1202.

Applying the same metallization techniques described above, metal lines 1802 and 1804 are formed in ILD 1702 using standard lithography and etching techniques to first pattern features (e.g., vias and/or trenches) in ILD 104 and then filling the features with a contact metal(s) to form the metal lines 1802 and 1804. A directional (anisotropic) etching process such as RIE can be employed for patterning the features. For features containing a via and a trench (see FIG. 18), a dual damascene process may be employed to form the trench over and aligned with the via. The via can be formed prior to the trench, or vice versa. When the via is formed before the trench, the process is referred to herein as a 'via-first' dual damascene process. Conversely, when the trench is formed before the via, the process is referred to herein as a 'trench first' dual damascene process.

As provided above, suitable contact metals include, but are not limited to, Cu, W, Ru, Co, Ni and/or Pt. A process such as evaporation, sputtering, or electrochemical plating can be employed to deposit the contact metal(s) into the features. Following deposition, the metal overburden can be removed using a process such as CMP. Prior to depositing the contact metal(s) into the features, a conformal barrier layer (not shown) can be deposited into and lining the features. As provided above, use of such a barrier layer helps to prevent diffusion of the contact metal(s) into the surrounding dielectric. Suitable barrier layer materials include, but are not limited to, Ru, Ta, TaN, Ti, and/or TiN. Additionally, a seed layer (not shown) can be deposited into and lining the features prior to contact metal deposition. As provided above, a seed layer facilitates plating of the contact metal into the features.

As shown in FIG. 18, metal line 1802 extends through the encapsulation layer 1602 and capping layer 202a and is in direct contact with interconnect 106 over the logic region of substrate 102. To access memory device 1202, the hardmask layer 910b and encapsulation layer 1602 have been removed from the top of pillar-shaped top electrode 908b. As shown in FIG. 18, metal line 1804 is in direct contact with the pillar-shaped top electrode 908b of the memory device 1202 over the memory region of substrate.

It is notable that the thickness of the pillar-shaped top electrode 908b eliminates any concerns about metal line 1804 shorting between the top electrode 908b and bottom electrode 904a of the memory device 1202. For instance, as shown in FIG. 18, even if metal line 1804 wraps around the top electrode 908b the thickness of top electrode 908b offsets the metal line 1804 from the dielectric element 906a and bottom electrode 904a. Further, due to the reduced width (W2) of the top electrode 908b (see above), the encapsulation layer 1602 is present between the metal line 1804 and the dielectric element 906a and bottom electrode 904a.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an embedded memory device, the method comprising the steps of:

depositing a first interlayer dielectric (ILD) on a substrate;

forming at least one first interconnect in the first ILD over a logic region of the substrate, and at least one second interconnect in the first ILD over a memory region of the substrate;

depositing a capping layer onto the first ILD over the at least one first interconnect and the at least one second interconnect;

forming a memory film stack on the capping layer, the memory film stack comprising a bottom electrode layer disposed on the capping layer, a dielectric layer disposed on the bottom electrode layer, and a top electrode layer disposed on the dielectric layer;

patterning the memory film stack into at least one memory device comprising a bottom electrode disposed on the capping layer over the at least one second interconnect, a dielectric element disposed on the bottom electrode, and a top electrode disposed on the dielectric element, wherein the at least one memory device has a width W1;

patterning the top electrode to form a pillar-shaped top electrode having a width W2, wherein W2<W1;

depositing a conformal encapsulation layer over the capping layer and the at least one memory device;

depositing a second ILD over the conformal encapsulation layer; and forming at least one first metal line in the second ILD in contact with the at least one first interconnect, and at least one second metal line in the second ILD in contact with the pillar-shaped top electrode.

2. The method of claim 1, wherein the bottom electrode has a thickness T1 and the pillar-shaped top electrode has a thickness T2, and wherein T2>T1.

3. The method of claim 2, wherein the thickness T1 is from about 2 nm to about 10 nm and ranges therebetween, and wherein the thickness T2 is from about 5 nm to about 15 nm and ranges therebetween.

4. The method of claim 1, wherein the capping layer comprises a material selected from the group consisting of: silicon nitride (SiN), silicon oxynitride (SiON), silicon oxycarbonitride (SiOCN), and combinations thereof.

5. The method of claim 1, wherein the bottom electrode layer comprises a material selected from the group consisting of: titanium nitride (TiN) having a Ti/N ratio of less than or equal to 1, tantalum nitride (TaN), tungsten (W), platinum (Pt), iridium (Ir), ruthenium (Ru), and combinations thereof.

6. The method of claim 1, wherein the dielectric layer comprises a metal oxide selected from the group consisting of: metal oxides such as hafnium oxide (HfO$_2$), lanthanum oxide (LaO$_2$), strontium titanate (SrTiO$_3$), and combinations thereof.

7. The method of claim 1, wherein the bottom electrode layer comprises a material selected from the group consisting of: TiN having a Ti/N ratio of greater than 1, tungsten titanium (TiW), titanium aluminum carbide (TiAlC), and combinations thereof.

8. The method of claim 1, wherein the conformal encapsulation layer comprises a material selected from the group consisting of: SiN, SiON, SiOCN, and combinations thereof.

9. The method of claim 1, further comprising the step of:

forming a contact that extends through the capping layer to connect the at least one memory device to the at least one second interconnect.

10. The method of claim 9, further comprising the steps of:

patterning a trench in the capping layer over the at least one second interconnect; and filling the trench with a metal to form the contact.

11. The method of claim 9, wherein the metal is selected from the group consisting of: W, TiN, TaN, and combinations thereof.

12. The method of claim 1, wherein the at least one second metal line wraps around the pillar-shaped top electrode.

13. The method of claim 1, wherein the conformal encapsulation layer is disposed between the at least one second metal line and the bottom electrode.

14. A method of forming an embedded memory device, the method comprising the steps of:

depositing a first interlayer dielectric (ILD) on a substrate;

forming at least one first interconnect in the first ILD over a logic region of the substrate, and at least one second interconnect in the first ILD over a memory region of the substrate;

depositing a capping layer onto the first ILD over the at least one first interconnect and the at least one second interconnect;

forming a contact that extends through the capping layer;

forming a memory film stack on the capping layer, the memory film stack comprising a bottom electrode layer disposed on the capping layer, a dielectric layer disposed on the bottom electrode layer, and a top electrode layer disposed on the dielectric layer;

patterning the memory film stack into at least one memory device comprising a bottom electrode disposed on the capping layer over the at least one second interconnect, a dielectric element disposed on the bottom electrode, and a top electrode disposed on the dielectric element, wherein the at least one memory device has a width W1, and wherein the contact connects the at least one memory device to the at least one second interconnect;

patterning the top electrode to form a pillar-shaped top electrode having a width W2, wherein W2<W1, and wherein the bottom electrode has a thickness T1 and the pillar-shaped top electrode has a thickness T2, wherein T2>T1;

depositing a conformal encapsulation layer over the capping layer and the at least one memory device;

depositing a second ILD over the conformal encapsulation layer; and forming at least one first metal line in the second ILD in contact with the at least one first interconnect, and at least one second metal line in the second ILD in contact with the pillar-shaped top electrode.

* * * * *